United States Patent
Akiyama

[11] Patent Number: 6,043,546
[45] Date of Patent: Mar. 28, 2000

[54] PLANAR CHANNEL-TYPE MOS TRANSISTOR

[75] Inventor: Naoto Akiyama, Tokyo, Japan

[73] Assignee: NEC Corporation, Tokyo, Japan

[21] Appl. No.: 09/050,432

[22] Filed: Mar. 31, 1998

[51] Int. Cl.[7] .......................... H01L 29/76; H01L 29/94; H01L 31/062; H01L 31/113; H01L 31/119

[52] U.S. Cl. .......................... 257/413; 257/382; 257/383; 257/412; 257/377; 257/387

[58] Field of Search .................... 257/382, 383, 257/377, 387, 412, 413, 407, 388

[56] References Cited

U.S. PATENT DOCUMENTS 5,214,304  5/1993  Ema et al. .............................. 257/412
5,757,045  5/1998  Tsai et al. .............................. 257/413

FOREIGN PATENT DOCUMENTS 59-213156  12/1984  Japan .
3-203366   9/1991   Japan .
8-167661   6/1996   Japan .

Primary Examiner—Mahshid Saadat
Assistant Examiner—Jesse A. Fenty
Attorney, Agent, or Firm—Sughrue, Mion, Zinn Macpeak & Seas, PLLC

[57] ABSTRACT

In the manufacture of a planar channel-type MOS transistor, an n-well is formed in a predetermined region of a p-type semiconductor substrate to define a p-channel transistor region in which element forming regions are located as a p-type active region and a p-type gate electrode. A p-type substrate region adjacent to the p-channel transistor region defines an n-channel transistor region in which element forming regions are located as an n-type active region and an n-type gate electrode. Titanium silicide is formed in self-alignment as an upper layer of each of the p- and n-type active regions and p- and n-type gate electrodes. A boundary of the p- and n-type gate electrodes is a nondoped region where the titanium silicide is formed in an increased thickness as compared to that of the titanium silicide formed on the remaining portion of the gate electrodes.

9 Claims, 5 Drawing Sheets

FIG.2 (a) (PRIOR ART)
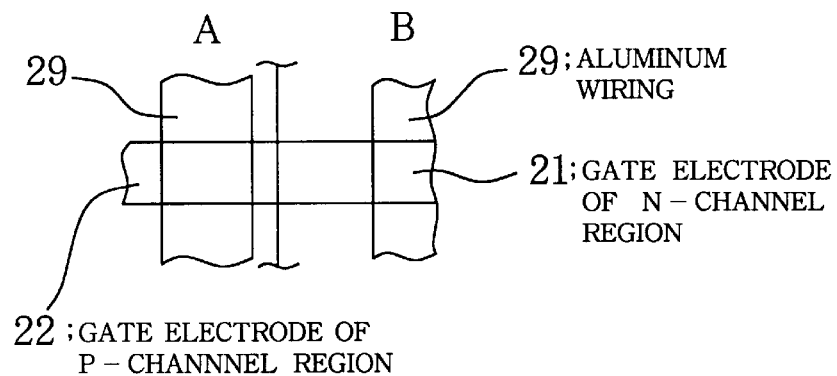
FIG.2 (b) (PRIOR ART)
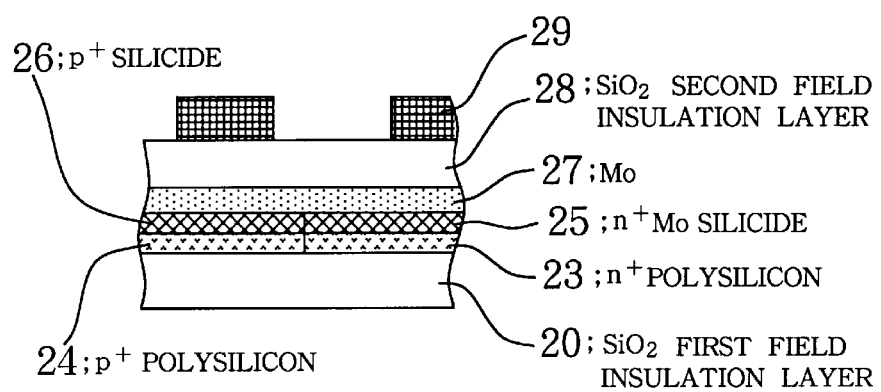

FIG.3 (a) (PRIOR ART)
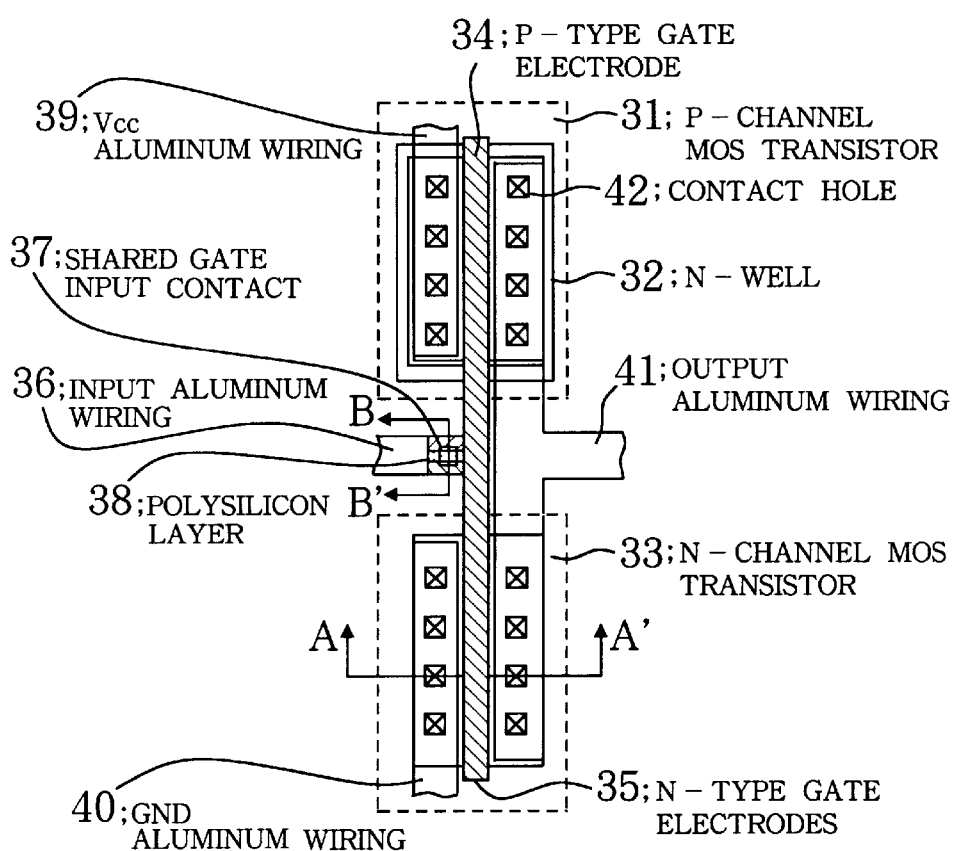

FIG.3 (b)   (PRIOR ART)
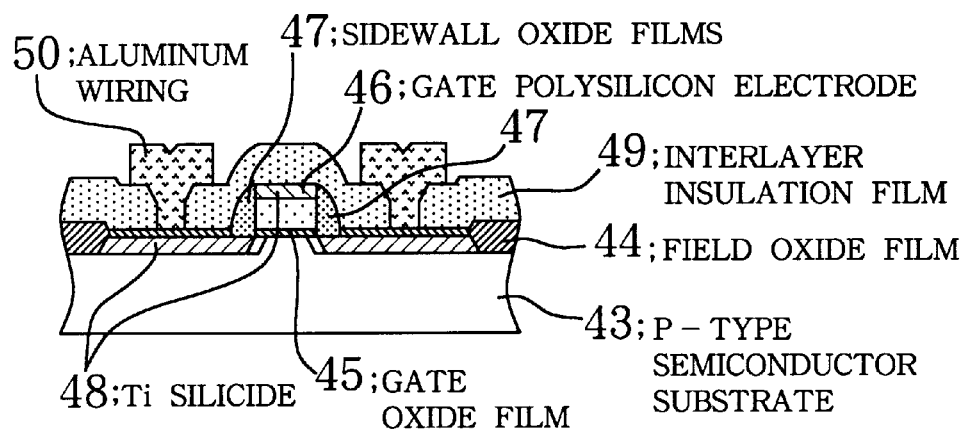
FIG.3 (c)   (PRIOR ART)
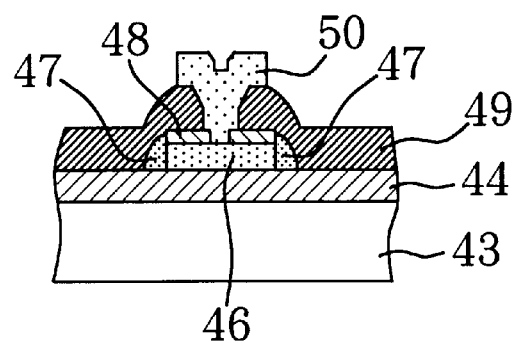

PLANAR CHANNEL-TYPE MOS TRANSISTOR

BACKGROUND OF THE INVENTION

1. Field of the Invention

The present invention relates to a semiconductor device and a method of manufacturing the semiconductor device, and more particularly to a planar channel-type transistor in which n-type polysilicon and p-type polysilicon are used as the respective gate electrodes of n- and p-channel transistors.

2. Description of the Related Art

A planar channel-type transistor is the conduction type in which n- and p-channel transistors have mutually different gate electrodes; the common problem with the transistors of this type is that the boundary of these two gate electrodes cannot take an ohmic contact and that to reduce its resistance, either an upper layer of the individual gate electrode or an active region on a semiconductor substrate has to be combined with a high-melting-point metal in self-alignment to form metal silicide.

Attempts have been made to realize such an ohmic contact. For example, in a first conventional CMOS (complementary metal oxide semiconductor) transistor technology disclosed in Japanese Patent Laid-Open Publication No. Sho59-213156, as shown in FIGS. 2(a) and 2(b) of the accompanying drawings of the present specification, a gate electrode 21 of an n-channel region B on a first field insulation (SiO$_2$) layer 20 has a three-layer structure composed of n$^+$ polysilicon 23, n$^+$ metal (molybdenum, Mo) silicide 25 and a high-melting-point metal (Mo) 27, while a gate electrode 22 of a p-type region A has likewise a three-layer structure composed of p$^+$ polysilicon 24, p$^+$ metal (Mo) silicide 26 and the above-mentioned high-melting-point metal (Mo) 27. At the boundary of the p- and n-channel regions, though the n$^+$ polysilicon 23 and p$^+$ polysilicon 24 assume a pn junction, the n$^+$ metal silicide 25 and p$^+$ metal silicide 26 are joined by an ohmic contact because of the high-melting-point metal (Mo) 27. Reference number 29 designates aluminum wiring insulated by a second field insulation (SiO$_2$) layer 28.

FIGS. 3(a) to 3(c) of the accompanying drawings show a second conventional CMOS transistor technology disclosed in Japanese Laid-Open Publication No. Hei3-203366. FIG. 3(a) is a fragmentary schematic plan view of the conventional CMOS transistor in which p- and n-channel MOS transistors, FIG. 3(b) is an enlarged schematic cross-sectional view taken along line A-A' of FIG. 3(a), and FIG. 3(c) is an enlarged schematic cross-sectional view taken along line B-B' of FIG. 3(a). In this second conventional technology, as shown in FIG. 3(a), an n-well 32 is formed in a predetermined region of a p-type semiconductor substrate to define a p-channel transistor region 31 in which element forming regions are located as a p-type active region and a p-type gate electrode 34. A p-type substrate region adjacent to the p-channel transistor region 31 defines an n-channel transistor region 33 in which element forming regions are located as an n-type active region and an n-type gate electrode 35. Titanium silicide (indicated by diagonal lines in FIG. 3(a)) is formed in self-alignment alignment as an upper layer of each of the p- and n-type active regions and p- and n-type gate electrodes 34, 35, thus constituting gate electrodes. To a boundary (shared gate input contact 37) of the p- and n-type gate electrodes 34, 35, the input aluminum wiring 36 is connected via which a gate input signal is to be transmitted. With the shared gate input contact 37 as their boundary, the silicide at the upper layer of the first gate electrode 34 and that at the upper layer of the second gate electrode 35 are separated from each other. Namely, after a shared gate electrode is formed of the same polysilicon layer 38, the polysilicon layer 38 except an intermediate region between the p- and n-channel MOS transistors 31, 33 is combined with titanium (Ti) to form silicide. And at the shared gate input contact 37, the input aluminum wiring 36 is connected to the silicide of each of the first and second gate electrodes 34, 35 as well as to the polysilicon layer 38 beneath the intermediate region between the first and second electrodes 34, 35.

Further, on opposite sides of each gate electrode 34, 35, source and drain regions for each of the p- and n-channel MOS transistors 31, 33 are provided. The source region of the p-channel MOS transistor 31 is connected to the supply potential (Vcc) aluminum wiring 39, and the source region of the n-channel MOS transistor 33 is connected to the ground potential (GND) aluminum wiring 40. And the drain regions of the p- and n-channel MOS transistors 31, 33 are connected to output aluminum wiring 41 via the corresponding contact holes 37.

More specifically, as shown in FIG. 3(b), on the p-type semiconductor substrate 43 over the entire surface except the active region, a field oxide film 44 is formed, and over the entire surface, a gate oxide film 45 is formed, whereupon the nondoped polysilicon is patterned into a gate polysilicon electrode 46 using lithography and etching technique.

Then phosphorus (P) is doped in the n-channel MOS transistor region to form an oxide film over its entire surface.

Subsequently, as shown in FIG. 3(c), photoresist is coated over a part (the exposed portion of the polysilicon layer 38 in FIG. 3(a)) of the joint of gates of p- and n-channel MOS transistors 31, 33 using lithography, and then the entire surface of the photoresist is etched to form opposite sidewall oxide films 47 at the gates of the transistor.

Then titanium (Ti) is sputtered over the entire surface and heated to form titanium silicide 48 as the diffused layer and polysilicon react with titanium (Ti). At that time, since the oxide film does not react with titanium (Ti), the gate polysilicon layer between p- and n-channel MOS transistors 31, 33 does not become silicide. Arsenic (As) is introduced into the n-channel MOS transistor region, and boron (B) is introduced into the p-channel MOS transistor region to dope the gate, source and drain of the n-channel transistor as N$^+$ and those of the p-channel transistor as P$^+$.

After that, an interlayer insulation film 49 grows and contact holes; 42 are formed, and then aluminum wiring 50 is patterned.

Thus in an effort to prevent mutual impurity diffusion through the individual silicide layers 48 on gate electrodes 34, 35, the respective silicide layers 48 on p- and n-type gates are mutually isolated at the gate junction and are then interconnected when the shared gate input contact 37 is formed.

However, these conventional technologies have been encountered with the following problems. For example, in the first conventional technology, although an ohmic contact between different conduction-type gate electrodes can be achieved, part of the high-melting-point metal would stay on the gate electrodes as residue so that either the upper layer of each gate electrode or the active region can be combined with the high-melting-point metal to form the silicide but only out of self-alignment.

In the second conventional technology, although mutual impurity diffusion between the p- and n-type gate electrodes through the silicide layers can be prevented, either downsizing of the individual elements or reducing the total number of necessary process steps is difficult to realize. If a silicide layer was formed merely in self-alignment on either the individual gate electrode or the active region, a pn junction would have been formed near the boundary of the p- and n-type gate electrodes so that chiefly only the thin silicide layer of each gate electrode would have become conductive, thus resulting in a non-stable semiconductor device.

SUMMARY OF THE INVENTION

It is therefore an object of the present invention to provide a semiconductor device in which silicide at the boundary of p- and n-type gate electrodes is increased in thickness to secure a fail-free electrical connection between the gate electrodes.

Another object of the invention is to provide a method of manufacturing the semiconductor device described in the previous paragraph.

According to a first aspect of the invention, the above first object is accomplished by a semiconductor device comprising: a single semiconductor substrate; an n-channel MOS transistor formed on the( semiconductor substrate and having a first gate electrode of n-type polysilicon; and a p-channel MOS transistor formed on the semiconductor substrate and having a second gate electrode of p-type polysilicon; either of an active region of the semiconductor substrate and an upper layer of each of the first and second gate electrodes being combined with a high-melting-point metal in self-alignment to form silicide, the silicide at a boundary region of the first and second gate electrodes being larger in thickness than that of the remaining region.

According to a second aspect of the invention, the above second object, is accomplished by a method of manufacturing a semiconductor device in the form of a planar channel-type MOS transistor, which is formed on a semiconductor substrate and has a pair of opposite sidewall oxide films on each of a pair of gate electrodes, by forming p- and n-type gate electrodes in p- and n-type MOS transistors, respectively, by ion implantation, comprising the steps of: leaving undoped a boundary region of the p- and n-type gates as a nondoped region; forming a film of high-melting-point metal over the entire surface of the semiconductor substrate; combining either of each of the p- and n-type gate electrodes and an active region on the semiconductor substrate with the high-melting-point metal by heating to form silicide in such a manner that the silicide in the nondoped region is larger in thickness than that in the remaining region; and removing unreacted part of the high-melting-point metal.

Preferably the high-melting-point metal is a selective one of titanium Ti), cobalt (Co), molybdenum (Mo), zirconium (Zr) and tungsten (W).

BRIEF DESCRIPTION OF THE DRAWINGS

The above and other objects, advantages and features of the present invention will be more apparent from the following description taken in conjunction with the accompanying drawings in which:

FIG. 2(a) is a schematic plan view, with parts cut away, of a conventional transistor device structure, showing a first conventional fabrication technology;

FIG. 2(b)) is a schematic vertical cross-sectional view showing the conventional transistor device structure;

FIG. 3(a) is a schematic plan view, with parts cut away, of another conventional transistor device structure, showing a second conventional fabrication technology;

FIG. 3(b) is an enlarged, schematic vertical cross-sectional view taken along line A-A' of FIG. 3(a); and FIG. 3(c) is an enlarged, schematic vertical cross-sectional view taken along line B-B' of FIG. 3(a).

DETAILED DESCRIPTION OF PREFERRED EMBODIMENT

The principles of the present invention are particularly useful when applied to a semiconductor device, particularly a planar channel-type MOS transistor, and a fabrication process therefor, an embodiment of which will now be described in detail with reference to the accompanying drawings.

Figure 1A:
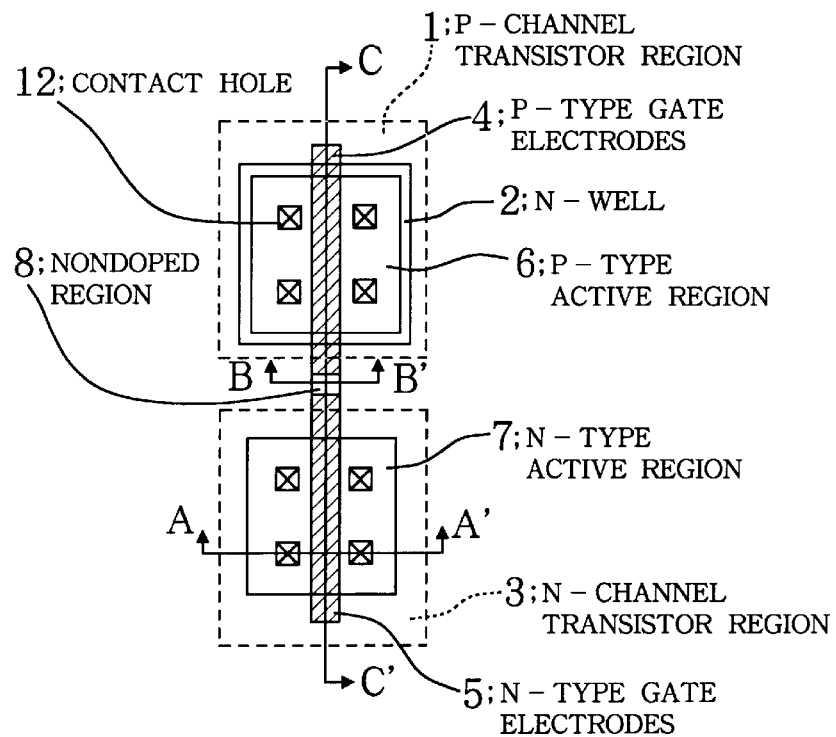
FIG. 1(a) is a schematic plan view, with parts cut away, of a semiconductor device according to one embodiment of the invention.

In FIG. 1(a), one rectangle (top) indicated by dashed lines defines a p-channel transistor region 1 in which an n-well 2 is formed in a predetermined region of a p-type semiconductor substrate and in which element forming regions are located as a p-type active region 6 and a p-type gate electrode 4. Another rectangle (bottom) indicated by dashed lines in FIG. 1(a) defines an n-channel transistor region 3 which occupies a p-type substrate region adjacent to the p-channel transistor region 1 and in which element forming regions are located as an n-type active region 7 and an n-type gate electrode 5. Reference number 12 designates a contact hole and reference number 13 designates an interlayer insulation film. Titanium silicide (indicated by diagonal lines in FIGS. 1(a) to 1(d) and unnumbered in FIG. 1(a)) 9 is formed in self-alignment in an upper layer of each of the p-type active region 6, n-type active region 7, p-type gate electrode 4 and n-type gate electrode 5. In the illustrated example, the titanium silicide 9 is a silicon compound in which silicon is combined with titanium whose melting point is high. Alternatively titanium may be substituted by a selective one of cobalt (Co), molybdenum (Mo), zirconium (Zr), tungsten (W) and other high-melting-point metals. A boundary portion of the p- and n-type gate electrodes 4, 5 is a nondoped region 8 where the titanium silicide 9 is formed in an increased thickness as compared to the thickness of the titanium silicide 9 formed on the remaining portion of the gate electrodes 4, 5.

Figure 1B:
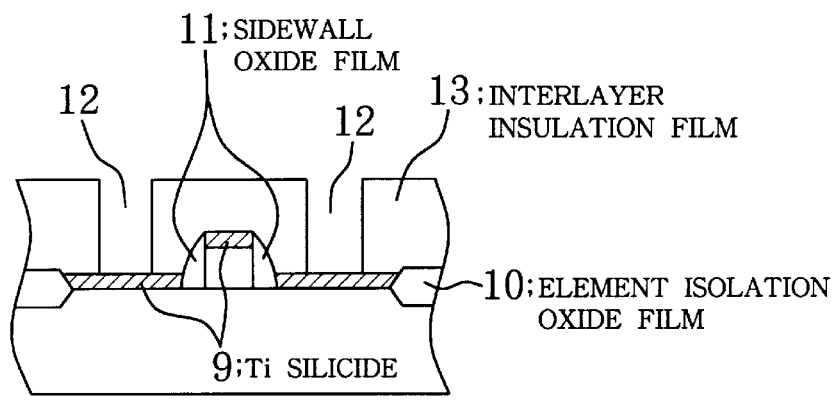
FIG. 1(b) is an enlarged vertical cross-sectional view taken along line A-A' of FIG. 1(a)
Figure 1C:
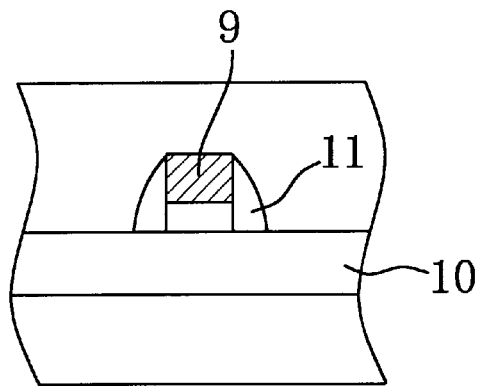
FIG. 1(c) is an enlarged, schematic vertical cross-sectional view taken along line B-B' of FIG. 1(a)
Figure 1D:
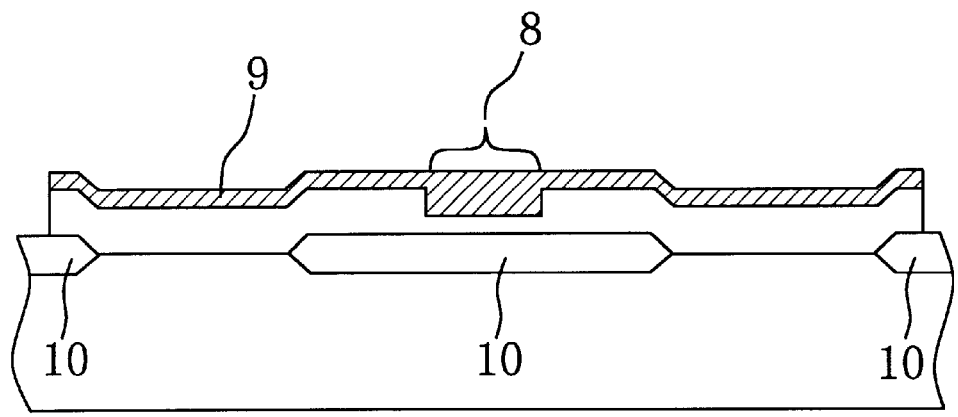
FIG. 1(d) is an enlarged, schematic vertical cross-sectional view taken along line C-C' of FIG. 1(a)

The structure of this planar channel-type transistor and its fabrication process will now be described in further detail with reference to FIGS. 1(b), 1(c) and 1(d). After an element isolation oxide film 10 and a nondoped polysilicon film having a thickness of approximately 1500 angstroms are formed on the p-type semiconductor substrate by the known technology, the oxide film is caused to grow through its entire surface and is then selectively etched to cause a sidewall oxide film 11 to grow. Then the p-type gate electrode 4, the n-type gate electrode 5, the p-type active region 6 and the n-type active region 7 are formed by photolithography, e.g., ion implantation using impurities such as boron (B) and arsenic (As) and, at the same time, the nondoped region 8 is formed on the boundary portion of the two gate electrodes 5, 6. For this purpose, a non-illustrated mask is employed such that the arsenic-free portion, in which arsenic (As) is prevented from being introduced, and the boron-free portion, in which boron (B) is prevented from being introduced, are superposed one over the other.

Subsequently, titanium (Ti) is sputtered in a thickness of approximately 300 angstroms over the entire surfaces of the active layer and each gate electrode, and the resulting active layer and the resulting gate electrodes are then heated to form titanium silicide 9 in self-alignment on either of the active layer and the individual gate electrode. At that time, since the impurities are not introduced into the nondoped region 8, the reaction for combining the polysilicon with the impurities progresses rapidly to form silicide larger in thickness by approximately tens angstroms than the remaining portion of the individual gate electrode 4, 5 other than the nondoped region 8. Finally, unreacted titanium is removed as residue, whereupon an large scale integrated circuit is formed on the resulting semiconductor device structure as usual by a conventional method.

As is described above, according to the present invention, in a planer channel-type MOS transistor, it is possible to secure a sure electrical connection at the boundary of the p- and n-type gate electrodes, thus realizing an error-free sophisticated semiconductor device without not only restricting the degree of freedom in downsizing but also increasing the number of necessary process steps.

It is thus apparent that the present invention is not limited to the illustrated embodiment but various modifications and changes may be suggested without departing from the scope and spirit of the invention.

What is claimed is:

1. A semiconductor device comprising:
   a single semiconductor substrate;
   an n-channel MOS transistor formed on said semiconductor substrate and having a first gate electrode of n-type polysilicon; and
   a p-channel MOS transistor formed on said semiconductor substrate and having a second gate electrode of p-type polysilicon;
   either of an active region of said semiconductor substrate and an upper layer of each of said first and second gate electrodes being combined with a high-melting-point metal in self-alignment to form a silicide, said silicide of a boundary region of said first and second gate electrodes being larger in thickness than that of the remaining region.

2. A semiconductor device according to claim 1, wherein said high-melting-point metal is a selective one of titanium (Ti), cobalt (Co), Molybdenum (Mo), Zirconium (Zr) and tungsten (W).

3. A semiconductor device according to claim 1, wherein said active region of said semiconductor substrate and said upper layer of each of said first and second gate electrodes are doped with two different kinds of impurities with said boundary portion of said first and second electrodes left undoped as a nondoped region.

4. A semiconductor device according to claim 3, wherein said silicide of said boundary portion of said first and second gate electrodes is larger in thickness by approximately tens angstroms than the remaining portion of said first and second gate electrodes other than said nondoped region.

5. A semiconductor device according to claim 1, wherein said impurities are boron (B) and arsenic (As).

6. A planar channel-type MOS transistor comprising:
   a single semiconductor substrate;
   an n-channel MOS transistor formed on said semiconductor substrate and having a first gate electrode of n-type polysilicon; and
   a p-channel MOS transistor formed on said semiconductor substrate and having a second gate electrode of p-type polysilicon;
   either of an active region of said semiconductor substrate and an upper layer of each of said first and second gate electrodes being combined with a high-melting-point metal in self-alignment to form a silicide, said silicide of a boundary region of said first and second gate electrodes being larger in thickness than that of the remaining region.

7. A planar channel-type MOS transistor according to claim 6, wherein said high-melting-point metal is a selective one of titanium (Ti), cobalt (Co), Molybdenum (Mo), Zirconium (Zr) and tungsten (W).

8. A planar channel-type MOS transistor according to claim 6, wherein said active region of said semiconductor substrate and said upper layer of each of said first and second gate electrodes are doped with two different kinds of impurities such as boron (B) and arsenic (As) with said boundary portion of said first and second electrodes left not doped as a nondoped region.

9. A planar channel-type MOS transistor according to claim 8, wherein said silicide of said boundary portion of said first and second gate electrodes is larger in thickness by approximately tens angstroms than the remaining portion of said first and second gate electrodes other than said nondoped region.

* * * * *